(12) United States Patent
Zhang et al.

(10) Patent No.: US 11,735,597 B2
(45) Date of Patent: Aug. 22, 2023

(54) ARRAY SUBSTRATE, DISPLAY PANEL, DISPLAY DEVICE AND METHOD OF MANUFACTURING AN ARRAY SUBSTRATE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Wenlong Zhang, Beijing (CN); Xu Zhang, Beijing (CN); Wei Zhang, Beijing (CN); Jianfei Tian, Beijing (CN); Jingyi Xu, Beijing (CN); Shuai Han, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 740 days.

(21) Appl. No.: 16/631,335

(22) PCT Filed: Dec. 21, 2018

(86) PCT No.: PCT/CN2018/122608
§ 371 (c)(1),
(2) Date: Jan. 15, 2020

(87) PCT Pub. No.: WO2019/223299
PCT Pub. Date: Nov. 28, 2019

(65) Prior Publication Data
US 2021/0257389 A1    Aug. 19, 2021

(30) Foreign Application Priority Data
May 24, 2018 (CN) .......................... 201810509233.2

(51) Int. Cl.
*H01L 27/12* (2006.01)
*G02F 1/1362* (2006.01)
*G02F 1/1345* (2006.01)

(52) U.S. Cl.
CPC ........ *H01L 27/124* (2013.01); *G02F 1/13458* (2013.01); *G02F 1/13629* (2021.01); *H01L 27/1237* (2013.01); *H01L 27/1244* (2013.01); *H01L 27/1259* (2013.01)
(Continued)

(58) Field of Classification Search
CPC ..... H01L 27/124–1244; G02F 1/13629; G02F 1/134327
See application file for complete search history.

(56) References Cited

U.S. PATENT DOCUMENTS

2006/0139551 A1* 6/2006 Kimura ................. G02F 1/1345
349/149
2007/0080416 A1   4/2007 Yoshioka et al.
(Continued)

FOREIGN PATENT DOCUMENTS

| CN | 1800925 A | 7/2006 |
| CN | 1945817 A | 4/2007 |

(Continued)

OTHER PUBLICATIONS

International Search Report and Written Opinion issued in corresponding International Application No. PCT/CN2018/122608, dated Apr. 1, 2019, with English translation.
(Continued)

*Primary Examiner* — Amar Mowa
(74) *Attorney, Agent, or Firm* — McDermott Will & Emery LLP

(57) ABSTRACT

An array substrate, includes: a substrate, three metal layers stacked on the substrate, and a plurality of signal line leads
(Continued)

disposed in a peripheral area of the array substrate. The plurality of signal line leads are distributed in at least two of the three metal layers.

16 Claims, 3 Drawing Sheets

(56) References Cited

U.S. PATENT DOCUMENTS

| | | |
|---|---|---|
| 2010/0200987 A1 | 8/2010 | Yoshioka et al. |
| 2013/0049004 A1* | 2/2013 | Sugawara ........... H01L 27/1281 257/E27.06 |
| 2017/0278452 A1 | 9/2017 | Oh et al. |
| 2018/0102083 A1 | 4/2018 | So et al. |
| 2019/0212855 A1 | 7/2019 | Shang |

FOREIGN PATENT DOCUMENTS

| | | |
|---|---|---|
| CN | 102799005 A | 11/2012 |
| CN | 106444182 A | 2/2017 |
| CN | 107037646 A | 8/2017 |
| CN | 107167971 A | 9/2017 |
| CN | 107229165 A | 10/2017 |
| CN | 107919067 A | 4/2018 |
| CN | 108732833 A | 11/2018 |

OTHER PUBLICATIONS

First Chinese Office Action issued in corresponding Chinese Application No. 201810509233.2, dated Sep. 2, 2019, with English language translation.

Second Chinese Office Action issued in corresponding Chinese Application No. 201810509233.2, dated Jun. 17, 2020, with English language translation.

* cited by examiner

ARRAY SUBSTRATE, DISPLAY PANEL, DISPLAY DEVICE AND METHOD OF MANUFACTURING AN ARRAY SUBSTRATE

CROSS-REFERENCE TO RELATED APPLICATIONS

This application is a national phase entry under 35 USC 371 of International Patent Application No. PCT/CN2018/122608 filed on Dec. 21, 2018, which claims priority to Chinese Patent Application No. 201810509233.2, filed on May 24, 2018, which are incorporated herein by reference in their entirety.

TECHNICAL FIELD

The present disclosure relates to the display field, and in particular, to an array substrate, a display panel, a display device, and a method of manufacturing an array substrate.

BACKGROUND

With the development of display technologies, products with high pixel density (i.e., pixels per inch), high resolution, and high screen-to-body ratio are favored by more and more consumers.

SUMMARY

According to one aspect of the present disclosure, an array substrate is provided. The array substrate includes a substrate, three metal layers stacked on the substrate, and a plurality of signal line leads disposed in a peripheral area of the array substrate. The plurality of signal line leads are distributed in at least two of the three metal layers.

In some embodiments, a plurality of orthographic projections of the plurality of signal line leads are formed on the substrate. A spacing between each two adjacent orthographic projections of the plurality of orthographic projections is the same.

In some embodiments, a plurality of orthographic projections of the plurality of signal line leads are formed on the substrate. Two signal line leads, orthographic projections of which are adjacent to each other, are distributed in different metal layers.

In some embodiments, the array substrate further includes a plurality of bonding pads disposed in the peripheral area. Each of the plurality of bonding pads is connected to a corresponding signal line lead of the plurality of signal line leads.

In some embodiments, the plurality of bonding pads are disposed in a same layer and are divided into N subsets. N is equal to a number of metal layers in which the plurality of signal line leads are distributed. Bonding pads of each subset are arranged in a line, and signal line leads connected to the bonding pads of each subset are distributed in a same metal layer.

In some embodiments, the plurality of signal line leads are distributed in two adjacent metal layers of the three metal layers, and the plurality of bonding pads are disposed in any metal layer of the two adjacent metal layers.

In some embodiments, the plurality of signal line leads are distributed in the three metal layers, and the plurality of bonding pads are disposed in a middle metal layer of the three metal layers.

In some embodiments, the plurality of signal line leads are distributed in two metal layers that are not adjacent of the three metal layers, and the bonding pads are disposed in a metal layer other than the two metal layers that are not adjacent.

In some embodiments, the three metal layers include a first metal layer, a second metal layer, and a third metal layer in a direction away from the substrate. The first metal layer includes a light-shielding layer. The second metal layer includes a plurality of gates. The third metal layer includes a plurality of sources and a plurality of drains.

In some embodiments, the plurality of signal line leads are data line leads, and are distributed in the first metal layer and the third metal layer. The plurality of bonding pads are disposed in the second metal layer.

In some embodiments, the array substrate further includes: a first insulating layer disposed between the first metal layer and the second metal layer, and a second insulating layer disposed between the second metal layer and the third metal layer. The first insulating layer includes first via holes. A first subset of the plurality of bonding pads is connected to signal line leads distributed in the first metal layer through the first via holes. The second insulating layer includes second via holes. Signal line leads distributed in the third metal layer are connected to a second subset of the plurality of bonding pads through the second via holes.

In some embodiments, the first metal layer is made of a same material as the second metal layer.

In some embodiments, the first metal layer is made of a same material as the third metal layer, and signal line leads disposed in the first metal layer have a same width as signal line leads disposed in the third metal layer.

In some embodiments, in metal layers in which the plurality of signal line leads are distributed, a number of signal line leads distributed in each metal layer is the same.

In some embodiments, the array substrate is a bottom-gate array substrate.

According to another aspect of the present disclosure, a display panel is provided. The display panel includes the array substrate according to embodiments of the present disclosure.

According to yet another aspect of the present disclosure, a display device is provided. The display device includes the display panel according to embodiments of the present disclosure.

According to yet another aspect of the present disclosure, a method of manufacturing an array substrate is provided. The method includes:
 providing a substrate; and
 forming three metal layers stacked on the substrate, wherein at least two of the three metal layers include a plurality of signal line leads disposed in a peripheral area of the array substrate.

In some embodiments, forming the three metal layers stacked on the substrate, includes:
 forming a first metal layer on the substrate, wherein the first metal layer includes a first portion of the plurality of signal line leads;
 forming a second metal layer at a side of the first metal layer away from the substrate, wherein the second metal layer includes a plurality of bonding pads configured to be connected to the plurality of signal line leads; and
 forming a third metal layer at a side of the second metal layer away from the substrate, wherein the third metal layer includes a second portion of the plurality of signal line leads.

In some embodiments, the method further includes:
 forming a first insulating layer on the side of the first metal layer away from the substrate;

forming first via holes in the first insulating layer, wherein the first via holes are configured to accommodate a part of a first subset of the plurality of bonding pads, such that the first subset of the plurality of bonding pads is electrically connected to the first portion of the plurality of signal line leads;

forming a second insulating layer on the side of the second metal layer away from the substrate; and forming second via holes in the second insulating layer, wherein the second via holes are configured to accommodate a part of the second portion of the plurality of signal line leads, such that the second portion of the plurality of signal line leads is electrically connected to a second subset of the plurality of bonding pads.

BRIEF DESCRIPTION OF THE DRAWINGS

In order to describe technical solutions in embodiments of the present disclosure more clearly, the accompanying drawings to be used in the description of embodiments will be introduced briefly. The accompanying drawings to be described below are merely some embodiments of the present disclosure. A person of ordinary skill in the art can obtain other accompanying drawings according to these accompanying drawings. The embodiments of the present disclosure are described in more detail with reference to the accompanying drawings and by means of non-limiting examples. In the accompanying drawings.

DETAILED DESCRIPTION

A pixel density, a resolution, and a screen-to-body ratio are important indexes for evaluating a display device. Signal lines (including, for example, data lines and gate lines) in a display area of a display device having a high pixel density and a high resolution are arranged very densely. Signal line leads, in a peripheral area (including, for example, a fan-out area) outside the display area, for connecting the signal lines to an integrated circuit (IC) are also arranged very densely. Since an area of the peripheral area of the display device having a high screen-to-body ratio is small, and the signal line leads are arranged very densely, a spacing between two adjacent signal line leads is very small. Therefore, a short circuit is easy to occur (for example, due to residues in a process of forming the signal line leads). If the signal line leads are designed to be very thin in order to avoid the short circuit, a broken circuit (for example, due to etching in a process of forming the signal line leads) may occur.

Figure 1:
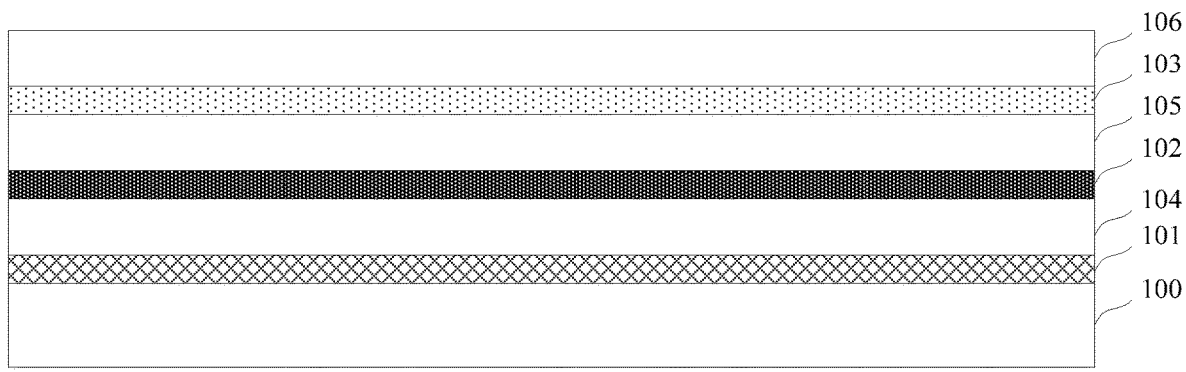
FIG. 1 is a schematic cross-sectional diagram of an array substrate; according to some embodiments of the present disclosure.

The present disclosure provides an array substrate. FIG. 1 is a schematic cross-sectional diagram of an array substrate, according to some embodiments of the present disclosure. The array substrate includes a substrate 100, and three metal layers that are stacked. The three metal layers may specifically be a first metal layer 101, a second metal layer 102, and a third metal layer 103. There may be a plurality of insulating layers among the first metal layer 101, the second metal layer 102, and the third metal layer 103. In some embodiments, the first metal layer 101, the second metal layer 102, and the third metal layer 103 are sequentially disposed in a direction away from the substrate 100.

Figure 2:
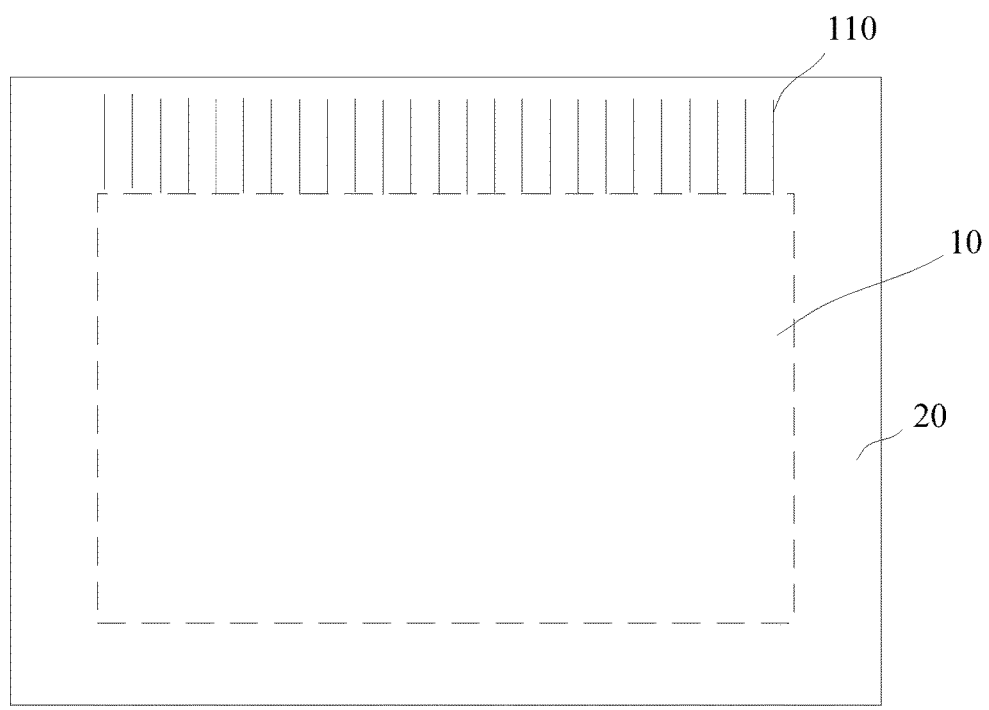
FIG. 2 is a schematic top view of an array substrate, according to some embodiments of the present disclosure.

FIG. 2 is a schematic top view of an array substrate, according to some embodiments of the present disclosure. As shown in FIG. 2, the array substrate includes a display area 10 and a peripheral region 20 surrounding the display area 10. The array substrate further includes a driving circuit. In some embodiments, the driving circuit includes thin film transistors. Each thin film transistor includes a gate, an insulating layer, an active layer, a source and a drain. The array substrate further includes a light-shielding layer for preventing the active layer of each thin film transistor from being affected by ambient light. There are a plurality of signal line leads 110 in the peripheral area 20. The signal line leads 110 are in one-to-one correspondence with signal lines in the display area 10. The signal line leads 110 are distributed in at least two of the first metal layer 101, the second metal layer 102, and the third metal layer 103.

In some embodiments of the present disclosure, the signal line leads 110 are divided into two parts or three parts.

In a case where the signal line leads 110 are divided into two parts, the signal line leads 110 are disposed in any two of the first metal layer 101, the second metal layer 102, and the third metal layer 103.

For example, a part of the signal line leads 110 are disposed in the first metal layer 101, and remaining signal line leads 110 are disposed in the second metal layer 102.

For example, a part of the signal line leads 110 are disposed in the first metal layer 101, and remaining signal line leads 110 are disposed in the third metal layer 103.

For example, a part of the signal line leads 110 are disposed in the second metal layer 102, and remaining signal line leads 110 are disposed in the third metal layer 103.

In a case where the signal line leads 110 are divided into three parts, the signal line leads 110 are disposed in each of the first metal layer 101, the second metal layer 102, and the third metal layer 103.

By arranging the signal line leads in two or three layers, a wiring density of the signal line leads is reduced, a spacing between two adjacent signal line leads is increased, and a risk of a short circuit is lowered. Since the wiring density is reduced, the signal line leads may be designed to be very thick. Thereby, a risk of a broken circuit is reduced.

In some embodiments, as shown in FIG. 2, the plurality of signal line leads 110 are arranged in parallel with each other, which facilitates to design and manufacture the plurality of signal line leads 110, and may avoid the short circuit.

In some embodiments, orthographic projections of the plurality of signal line leads 110 on the substrate 100 are uniformly distributed. More specifically, the orthographic projections are equidistantly arranged. That is, a spacing between each two adjacent orthographic projections is the same. The orthographic projections of the signal line leads 110 in different layers on the substrate 100 are alternately arranged. In other words, two signal line leads 110, orthographic projections of which are adjacent to each other, are distributed in different metal layers. Term "uniformly distributed" means that the orthographic projections of all the signal line leads 110 are parallel to each other and the spacing between each two adjacent orthographic projections is the same.

In some embodiments, the number of signal line leads 110 distributed in each layer is the same or approximately the same, and orthographic projections of the signal line leads are alternately arranged. Thereby, the spacing between two adjacent signal line leads 110 and a width of each signal line lead 110 may be maximized, and the risk of the short circuit and the risk of the broken circuit may be further reduced. For example, in a case where the signal line leads 110 are distributed in the third metal layer 103 and the first metal layer 101, orthographic projections adjacent to orthographic projections of signal line leads 110 distributed in the third metal layer 103 on the substrate 100 are orthographic projections of signal line leads 110 distributed in the first metal layer 101 on the substrate 100, and the spacing between any two adjacent orthographic projections is the same. If the orthographic projections of the signal line leads 110 distributed in the third metal layer 103 on the substrate 100 are referred to as third orthographic projections, and the orthographic projections of the signal line leads 110 distributed in the first metal layer 101 on the substrate 100 are referred to as first orthographic projections, an orthographic projection adjacent to one first orthographic projection is a third orthographic projection, and an orthographic projection adjacent to one third orthographic projection is a first orthographic projection.

In some embodiments, the first metal layer 101 may be a layer in which the light-shielding layer is located, the second metal layer 102 may be a layer in which the gates are located, and the third metal layer 103 may be a layer in which the sources and the drains are located. The signal line leads 110 may be data line leads. In a display panel including the array substrate, the number of data lines is greater than gate lines. In addition, a problem of a dense arrangement of gate line leads may be solved by using a gate driving (i.e., a gate on array) technique. Therefore, as for a display panel with a high resolution, a problem of a dense arrangement of the data line leads is more serious. The data line leads are disposed in the third metal layer 103 and the first metal layer 101. On one hand, the problem of the dense arrangement of the data line leads may be alleviated as much as possible by arranging the data line leads in the third metal layer 103 and the first metal layer 101. On another hand, a fact that the data line leads are only located in two layers facilitates to design and manufacture the data line leads. In addition, in a bottom-gate array substrate or a top-gate array substrate, a spacing between the third metal layer 103 and the second metal layer 102 is small, and a spacing between the second metal layer 102 and the first metal layer 101 is small. Therefore, a sum of a distance from the third metal layer 103 to a layer where bonding pads are located and a distance from the first metal layer 101 to the layer where the bonding pads are located is very small (compared to a common electrode layer, a touch electrode layer, etc.). This arrangement facilitates a connection of the data line leads to the bonding pads. Of course, in other implementations, the signal line leads 110 may also be the gate line leads or touch line leads or the like.

In some embodiments of the present disclosure, the array substrate further includes a plurality of bonding pads disposed in the peripheral area. Each bonding pad is connected to a corresponding signal line lead of the signal line leads. Term "a corresponding signal line lead" means that the signal line leads 110 are in one-to-one correspondence with the bonding pads, and each signal line lead 110 is connected to a corresponding bonding pad of the plurality of bonding pads. The signal line leads 110 are connected to an IC in the driving circuit through the bonding pads, thereby transmitting control signals from the IC to the signal lines through the signal line leads 110.

In some embodiments of the present disclosure, the plurality of bonding pads are located in a same layer, which facilitates a connection to the IC in the driving circuit. In some embodiments, the plurality of bonding pads are divided into N subsets. N is equal to the number of the metal layers in which the plurality of signal line leads are distributed. Bonding pads of each subset are arranged in a line, and signal line leads connected to the bonding pads of each subset are distributed in a same metal layer. That is, bonding pads connected to signal line leads 110 in a same layer belong to a single subset and are arranged in a line. Bonding pads in a line refer to a plurality of bonding pads spaced apart along a straight line. In a case where the bonding pads are arranged in a plurality of lines, the lines of the bonding pads are disposed in parallel with each other. The number of the lines of the bonding pads is the same as the number of metal layers in which the signal line leads 110 are distributed. Bonding pads in each line are connected to the signal line leads 110 in the same layer. A gap between the bonding pads is made very large by arranging the bonding pads in different layers in the plurality of lines, thereby avoiding a short circuit of the bonding pads. The lines of the bonding pads may be disposed along a row direction of the array substrate, or may be disposed along a column direction of the array substrate, or may be disposed in other directions, which is not limited in the present disclosure.

In some embodiments, the signal line leads 110 are distributed in two metal layers, and the bonding pads are distributed in two lines. Signal line leads 110 distributed in a metal layer are connected to bonding pads in one of the two lines, and signal line leads 110 distributed in the other metal layer are connected to bonding pads in the other line of the two lines. For example, in a case where the signal line leads 110 are distributed in the first metal layer 101 and the third metal layer 103, the signal line leads 110 in the first metal layer 101 are connected to bonding pads in a first line of the two lines, and the signal line leads 110 in the third metal layer 103 are connected to bonding pads in a second line of the two lines.

In some other embodiments, the signal line leads 110 are distributed in three metal layers, and the plurality of bond pads are distributed in three lines. The signal line leads 110 in the first metal layer 101 are connected to bonding pads in a first line of the three lines, and signal line leads 110 in the second metal layer 102 are connected to bonding pads in a second line of the three lines, and the signal line leads 110 in the third metal layer 103 are connected to bonding pads in a third line of the three lines.

In some embodiments of the present disclosure, in a case where the signal line leads 110 are distributed in two adjacent metal layers of the first metal layer 101, the second metal layer 102, and the third metal layer 103 (for example, the signal line leads 110 are distributed in the first metal layer 101 and the second metal layer 102, or the signal line leads 110 are distributed in the second metal layer 102 and the third metal layer 103), the bonding pads are distributed in any one of the two adjacent metal layers. In a case where the signal line leads 110 are located in two metal layers that are not adjacent of the first metal layer 101, the second metal layer 102, and the third metal layer 103 (for example, the signal line leads 110 are distributed in the first metal layer 101 and the third metal layer 103), the bonding pads are disposed in a metal layer other than the two metal layers that are not adjacent (for example, the second metal layer 102). In a case where the signal line leads 110 are distributed in each of the first metal layer 101, the second metal layer 102, and the third metal layer 103, the bonding pads are disposed in a middle metal layer (for example, the second metal layer 102) of the first metal layer 101, the second metal layer 102, and the third metal layer 103.

In some embodiments, the first metal layer 101 is the layer in which the light-shielding layer is located, the second metal layer 102 is the layer in which the gates are located, and the third metal layer 103 is the layer in which the sources and the drains are located. In some embodiments, the array substrate is a bottom-gate array substrate. The bottom-gate array substrate refers to an array substrate including bottom-gate thin film transistors. The bottom-gate thin film transistors refer to thin film transistors in which gates are located between the active layers and the substrate. In a case where the bottom-gate array substrate is adopted, the first metal layer 101, the second metal layer 102, and the third metal layer 103 are sequentially disposed in a direction away from the substrate 100, that is, the second metal layer 102 is located between the first metal layer 101 and the third metal layer 103. In this case, in the case where the signal line leads 110 are distributed in the first metal layer 101 and the second metal layer 102, the bonding pads are located in any layer of the first metal layer 101 and the second metal layer 102. In the case where the signal line leads 110 are distributed in the second metal layer 102 and the third metal layer 103, the bonding pads are located in any layer of the second metal layer 102 and the third metal layer 103. In the case where the signal line leads 110 are distributed in the first metal layer 101 and the third metal layer 103, or in the case where the signal line leads 110 are distributed in each of the first metal layer 101, the second metal layer 102, and the third metal layer 103, the bonding pads are located in the second metal layer 102.

In some other embodiments, the array substrate is a top-gate array substrate. The top-gate array substrate refers to an array substrate including top-gate thin film transistors. The top-gate thin film transistors refer to thin film transistors in which the active layers are located between gates and both of sources and drains. The third metal layer 103 is located between the first metal layer 101 and the second metal layer 102. In this case, in the case where the signal line leads 110 are distributed in the first metal layer 101 and the third metal layer 103, the bonding pads are located in any layer of the first metal layer 101 and the third metal layer 103. In the case where the signal line leads 110 are distributed in the second metal layer 102 and the third metal layer 103, the bonding pads are located in any layer of the second metal layer 102 and the third metal layer 103. In the case where the signal line leads 110 are located in the first metal layer 101 and the second metal layer 102, or in the case where the signal line leads 110 are located in each of the first metal layer 101, the third metal layer 103, and the second metal layer 102, the bonding pads are located in the third metal layer 103.

The arrangement manners of the bonding pads described above facilitate a connection of the signal line leads 110 to the bonding pads.

Figure 3:
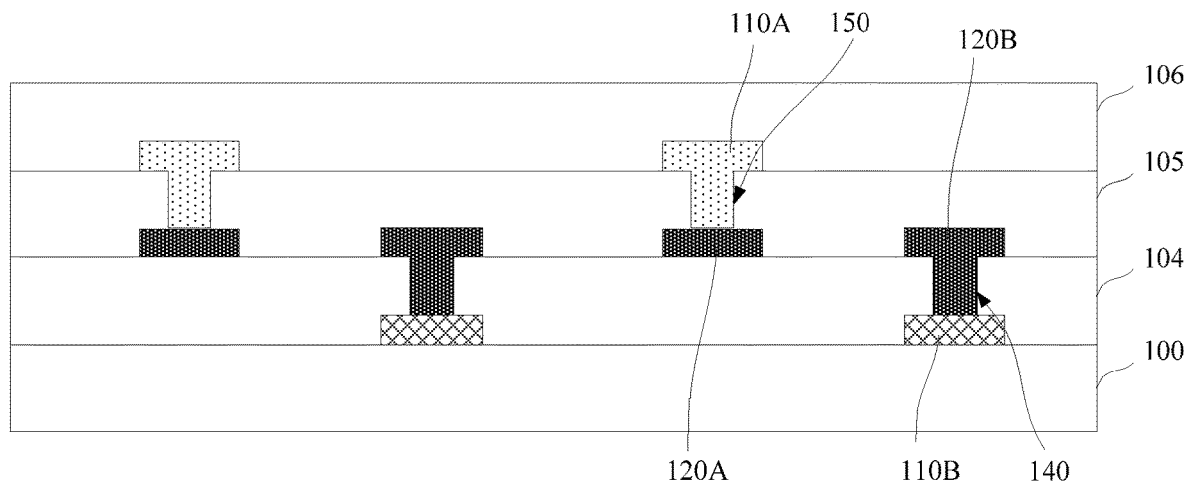
FIG. 3 is a schematic cross-sectional diagram of an arrangement of both signal line leads and bonding pads of an array substrate, according to some embodiments of the present disclosure.

FIG. 3 is a schematic cross-sectional diagram of an arrangement of both signal line leads and bonding pads of an array substrate, according to some embodiments of the present disclosure. As shown in FIG. 3, the signal line leads include data line leads 110A distributed in the third metal layer and data line leads 110E distributed in the first metal layer. There is a second insulating layer 105 between the third metal layer and the second metal layer. The data line leads 110A extend to the bonding pads 120A located in the second metal layer through second via holes 150 in the second insulating layer 105, such that signals from the IC may be transmitted to data lines through the data line leads 110A. Widths of the second via holes 150 are less than widths of the data line leads 110A in the third metal layer. There is a first insulating layer 104 between the first metal layer and the second metal layer. Bonding pads 120B located in the second metal layer extend to the data line leads 110E through first via holes 140 in the first insulating layer 104, such that signals from the IC may be transmitted to data lines through the data line leads 110B. Sizes of the first via holes 140 are less than sizes of the bonding pads 120B. In the bottom-gate array substrate shown in FIG. 3, the bonding pads are located in the second metal layer. A distance between the second metal layer and the third metal layer, and a distance between the second metal layer and the first metal layer are both very small. Therefore, the data line leads may be firmly connected to the bonding pads, which ensures an electrical transmission of the signals. Of course, the array substrate may also be the top-gate array substrate.

In the peripheral area of the array substrate, there may be the first insulating layer 104 between the first metal layer 101 and the second metal layer 102. There may be the second insulating layer 105 between the second metal layer 102 and the third metal layer 103. There may be a third insulating layer 106 above the third metal layer 103. The first insulating layer 104 and the second insulating layer 105 are used to achieve insulation among the first metal layer 101, the second metal layer 102, and the third metal layer 103. The third insulating layer 106 is used to protect an entire array substrate.

The first insulating layer 104 includes at least one of a buffer layer or a gate insulating layer. The second insulating layer 105 may be an interlayer insulating layer (also known as an interlayer dielectric layer, IDL). The third insulating layer 106 includes a planarization (PLN) layer and a protective layer.

The substrate 100 may be a transparent base substrate such as a glass substrate. The buffer layer, the gate insulating layer, and the interlayer insulating layer may be silicon nitride layers or silicon oxynitride layers. The protective layer may be a polyvinyl chloride (PVX) layer. The second metal layer and the third metal layer may be metal electrode layers, which include, for example, aluminum (Al), copper (Cu), molybdenum (Mo), chromium (Cr), titanium (Ti), or may be alloy electrode layers. The second metal layer and the third metal layer may also be oxide electrode layers. For example, the second metal layer and the third metal layer may be indium tin oxide (ITO) electrode layers or indium zinc oxide (IZO) electrode layers. A material of the first metal layer may be a metal material, which includes, for example, an opaque metal such as Al or silver (Ag).

In some embodiments, the first metal layer and the second metal layer may be made of a same material. Thus, there is no need to change the material during a process of manufacturing the first metal layer and the second metal layer, which facilitates a manufacturing of the array substrate. In addition, the bonding pads in the second metal layer and the data line leads in the first metal layer are made of a same material. In this way, a contact resistance between the data line leads and the bonding pads may be reduced, and an electrical connection performance may be better.

In some embodiments, the first metal layer and the third metal layer may be made of a same material, and widths of the data line leads in the first metal layer are the same as the widths of the data line leads in the third metal layer. In this way, signal transmission capabilities of the data line leads in different layers may be made substantially the same by using the data line leads that are made of the same material and have the same width, thereby ensuring a normal operation of the display panel.

As described above, in some embodiment of FIG. 3, the data line leads are distributed in the first metal layer and the third metal layer. In a case where data lines are disposed in the third metal layer, the first insulating layer 104 and the second insulating layer 105 each include third via holes (not shown in FIG. 3) for communicating the data line leads 110A disposed in the first metal layer with the data lines disposed in the third metal layer in the display area. The data line leads are connected to the data lines through the third via holes to ensure that the data lines are electrically connected to the IC through the bonding pads. The third via holes are located at one end of the data line leads 110A proximate to the display area.

Figure 4:
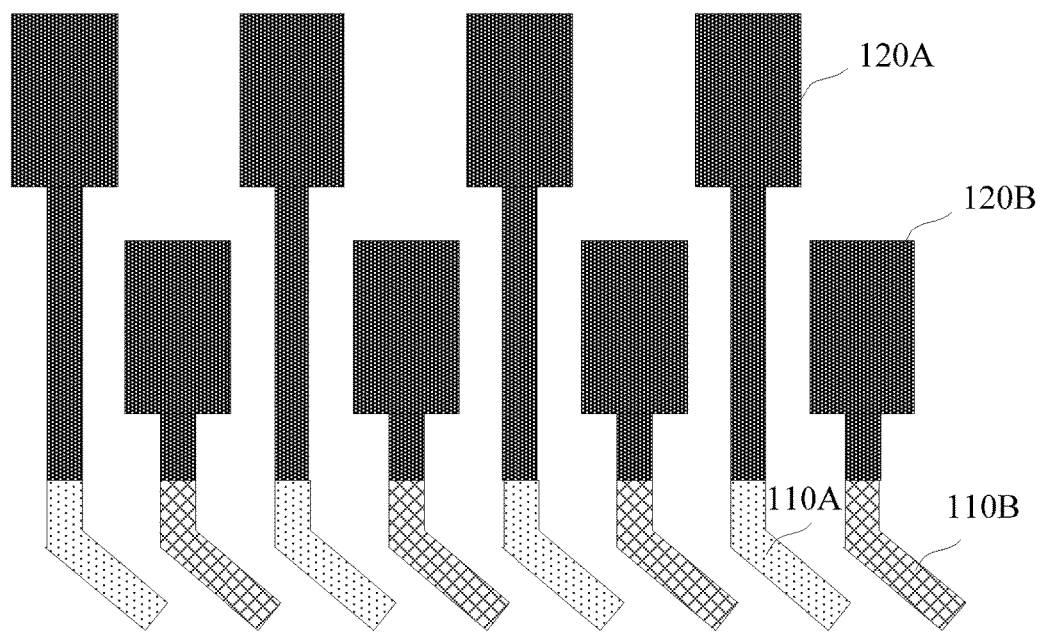
FIG. 4 is a schematic top view of an arrangement of both signal line leads and bonding pads of an array substrate, according to some embodiments of the present disclosure.

FIG. 4 is a schematic top view of an arrangement of both signal line leads and bonding pads of an array substrate, according to some embodiments of the present disclosure. Such an arrangement of the bonding pads may be used in the array substrate shown in FIG. 3. As shown in FIG. 4, there are two lines of the bonding pads 120A and 120B in the peripheral area. One line of the bonding pads 120A are connected to the data line leads 110A in the third metal layer, and the other line of the bonding pads 120B are connected to the data line leads 110B in the first metal layer. In a case where the bonding pads are divided into two lines, the gap between the bonding pads may be designed to be very large to avoid the short circuit. As shown in FIG. 4, the two lines of the bonding pads are staggered, which facilitates the connection of the bonding pads to the data line leads 110A or 110B.

Figure 5:
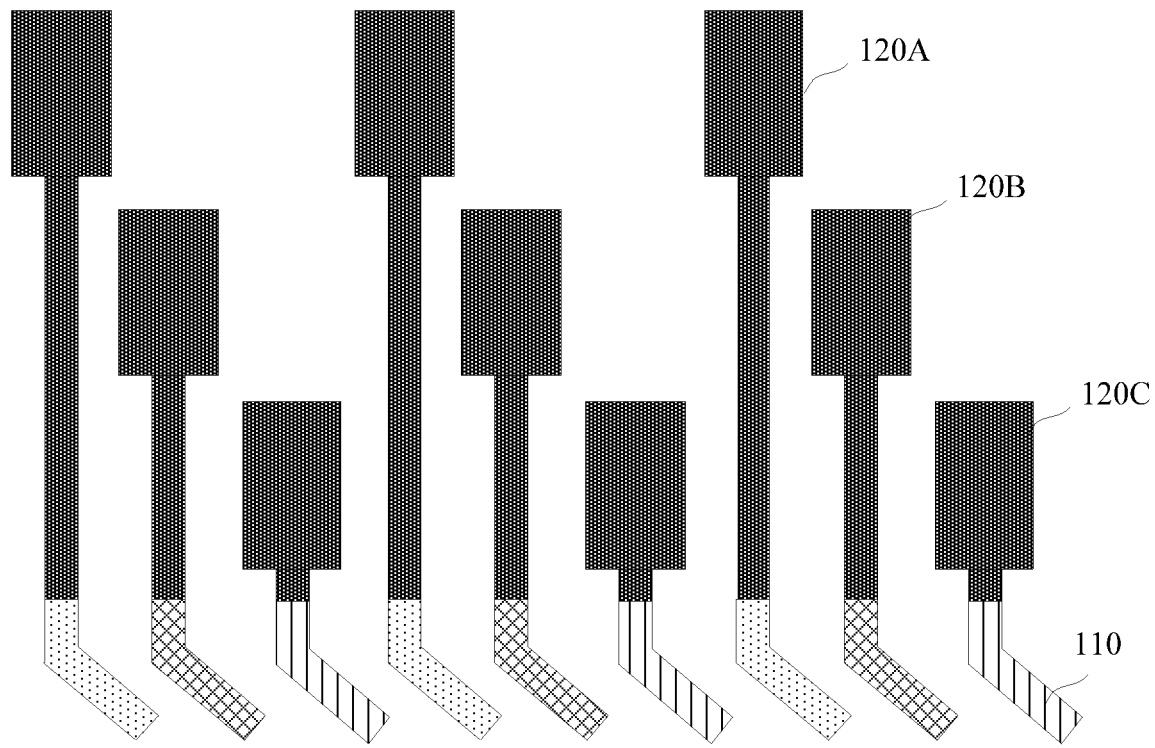
FIG. 5 is a schematic top view of another arrangement of both signal line leads and bonding pads of an array substrate; according to some embodiments of the present disclosure.

FIG. 5 is a schematic top view of another arrangement of both signal line leads and bonding pads of an array substrate, according to some embodiments of the present disclosure. As shown in FIG. 5, there are three lines of the bonding pads 120A, 120B and 1200 in the peripheral area. Bonding pads 120A in a line are connected to the data line leads in the first metal layer, bonding pads 1200 in another line are connected to the data line leads in the second metal layer, and bonding pads 120B in a remaining line are connected to the data line leads in the third metal layer.

Some embodiments of the present disclosure provide a display panel. The display panel includes the array substrate according to the embodiments of the present disclosure.

Some embodiments of the present disclosure provide a display device. The display device includes the display panel according to the embodiments of the present disclosure. The display device provided by the embodiments of the present disclosure may be any product or component having a display function, such as a mobile phone, a tablet computer, a television, a display, a notebook computer, a digital photo frame, or a navigator.

Figure 6:
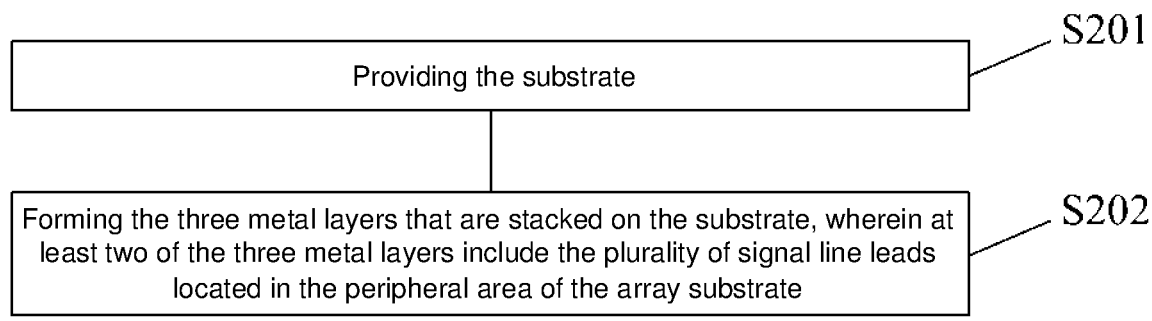
FIG. 6 is a flow diagram of a method of manufacturing an array substrate, according to some embodiments of the present disclosure.

FIG. 6 is a flow diagram of a method of manufacturing an array substrate, according to some embodiments of the present disclosure. As shown in FIG. 6, the method includes:

step 201 (S201): providing the substrate; and step 202 (S202): forming the three metal layers that are stacked on the substrate, wherein at least two of the three metal layers include the plurality of signal line leads located in the peripheral area of the array substrate.

In some embodiments, the substrate may be the transparent substrate, such as the glass substrate.

In some embodiments, the signal line leads are the data line leads. The data line leads are disposed in the third metal layer and the first metal layer. By arranging the data line leads in the third metal layer and the first metal layer, on one hand, the problem of the dense arrangement of the data line leads may be effectively alleviated, and on another hand, the fact that the data line leads are only located in two layers facilitates to design and manufacture the data line leads. Since the distance from the third metal layer to the layer where the bonding pads are located and the distance from the first metal layer to the layer where the bonding pads are located are very small, it facilitates the connection to the bonding pads.

Specifically, the step of forming the three metal layers that are stacked on the substrate, includes: forming the first metal layer on the substrate, wherein the first metal layer includes a first portion of the plurality of signal line leads; forming the second metal layer at a side of the first metal layer away from the substrate, wherein the second metal layer includes the bonding pads connected to the plurality of signal line leads; and forming the third metal layer at a side of the second metal layer away from the substrate, wherein the third metal layer includes a second portion of the plurality of signal line leads.

In some embodiments, the method further includes: forming the first insulating layer on the side of the first metal layer away from the substrate, and forming the first via holes in the first insulating layer. The first via holes are configured to accommodate a part of a first subset of the bonding pads, such that the first subset is electrically connected to the first portion of the plurality of signal line leads (for example, the signal line leads disposed in the first metal layer). The bonding pads are located in the peripheral area and located in the second metal layer. The data line leads disposed in the first metal layer are connected to the first subset of the bonding pads through the first via holes to ensure that the data lines are electrically connected to the IC through the bonding pads.

Further, the method further includes: forming the second insulating layer on the side of the second metal layer away from the substrate, and forming the second via holes in the second insulating layer. The second via holes are configured to accommodate a part of the second portion of the plurality of signal line leads (for example, the signal line leads disposed in the third metal layer), such that the second portion of the plurality of signal line leads is electrically connected to a second subset of the bonding pads. The data line leads disposed in the third metal layer are connected to the second subset of the bonding pads through the second via holes to ensure that the data lines are electrically connected to the IC through the bonding pads.

The data line leads may also be distributed in two adjacent metal layers or in the three metal layers. Manufacturing methods in these implementations are similar to the above contents, and are within the protection scope of the present disclosure. These contents are omitted for reasons of simplicity only.

Hereinafter, the method of manufacturing the array substrate according to the embodiments of the present disclosure will be further described by taking the bottom-gate array substrate as an example.

Firstly, the substrate 100 is provided. Then, the first metal layer is formed on the substrate 100. Other structures, which include but are not limited to the buffer layer, between the first metal layer and the substrate are not excluded. The first metal layer includes the data line leads 110B. Then, the first insulating layer 104 is formed on the first metal layer. Thereafter, the first via holes 140 are formed on the first insulating layer. The first via holes extend to the data line leads 110B. Then, the second metal layer is formed on the first insulating layer. The second metal layer includes the bonding pads 120. A part of the first subset of the bonding pads 120 is formed in the first via holes 140 and is connected to the data line leads 110E in the first metal layer through the first via holes 140. Then, the second insulating layer 105 is formed on the second metal layer. Thereafter, the second via holes 150 are formed on the second insulating layer 105. The second via holes extend to the second subset of the bonding pads 120 that is different from the first subset. Then, the third metal layer is formed on the second metal layer 105. There are the data line leads 110A in the third metal layer. A part of the data line leads 110A in the third metal layer are formed in the second via holes 150 and are connected to the second subset of the bonding pads 120 in the second metal layer through the second via holes 150. Then, the third insulating layer 106 may be formed on the third metal layer. The third insulating layer may cover the data line leads 110A.

In some embodiments, the first via holes and the second via holes may be manufactured by using patterning technologies including, but not limited to, an etching process.

In summary, the present disclosure provides an array substrate, a display panel, a display device, and a method of manufacturing an array substrate. The array substrate includes the substrate, the three metal layers stacked on the substrate, and the plurality of signal line leads disposed in the peripheral area of the array substrate. The plurality of signal line leads are distributed in at least two of the three metal layers.

In the embodiments of the present disclosure, the signal line leads are disposed in at least two of the three metal layers. Therefore, the wiring density of the signal line leads is alleviated, the spacing between the signal line leads is large, and the risk of the short circuit is lowered. Since the wiring density is reduced, the signal line leads may be designed to be very thick, thereby avoiding the risk of the broken circuit.

It will be appreciated that the above embodiments are described by means of examples only. Although the embodiments have been illustrated and described in detail in the accompanying drawings and the foregoing descriptions, such illustrations and descriptions are considered to be illustrative or exemplary and not restrictive, and the present disclosure is not limited to the embodiments disclosed.

By studying the accompanying drawings, disclosures and appended claims, when those skilled in the art put the disclosures requested to be protected, other variations of the disclosed embodiments may be understood and attained. In the claims, word "comprising including" does not exclude other elements or steps, and indefinite article "a" does not exclude a plural. Terms "first", "second", "third" and similar terms are only used for a naming purpose, and do not indicate a sequence or a positional relationship. The terms used in such a way are interchangeable where appropriate. The embodiments described herein may be implemented in a sequence other than that described or elaborated herein. A mere fact that certain steps are enumerated in different dependent claims does not mean that a combination of these steps cannot be used for profit.

What is claimed is:

1. An array substrate, comprising:
    a substrate,
    three metal layers stacked on the substrate,
    a plurality of signal line leads disposed in a peripheral area of the array substrate, and
    a plurality of bonding pads disposed in the peripheral area, wherein
    the plurality of signal line leads are distributed in at least two of the three metal layers;
    the plurality of signal line leads are connected to an integrated circuit in a driving circuit through the plurality of bonding pads, and each of the plurality of bonding pads is connected to a corresponding signal line lead of the plurality of signal line leads; and
    the plurality of bonding pads are disposed in a same layer and are divided into N subsets, N is equal to a number of metal layers in which the plurality of signal line leads are distributed, the plurality of bonding pads are arranged in N different lines that are parallel to each other, each subset of bonding pads are arranged in a respective line of the N different lines such that each subset of bonding pads extend to different lengths with respect to one another, and signal line leads connected to the bonding pads of each subset are distributed in a same metal layer.

2. The array substrate according to claim 1, wherein a plurality of orthographic projections of the plurality of signal line leads are formed on the substrate, and a spacing between each two adjacent orthographic projections of the plurality of orthographic projections is the same.

3. The array substrate according to claim 1, wherein a plurality of orthographic projections of the plurality of signal line leads are formed on the substrate, and two signal line leads, orthographic projections of which are adjacent to each other, are distributed in different metal layers.

4. The array substrate according to claim 1, wherein the plurality of signal line leads are distributed in two adjacent metal layers of the three metal layers, and the plurality of bonding pads are disposed in any metal layer of the two adjacent metal layers.

5. The array substrate according to claim 1, wherein the plurality of signal line leads are distributed in the three metal layers, and the plurality of bonding pads are disposed in a middle metal layer of the three metal layers.

6. The array substrate according to claim 1, wherein the plurality of signal line leads are distributed in two metal layers, which are not adjacent to each other, of the three metal layers, and the bonding pads are disposed in a metal layer other than the two metal layers that are not adjacent to each other.

7. The array substrate according to claim 6, wherein the three metal layers include a first metal layer, a second metal layer and a third metal layer in a direction away from the substrate, the first metal layer includes a light-shielding layer, the second metal layer includes a plurality of gates, and the third metal layer includes a plurality of sources and a plurality of drains.

8. The array substrate according to claim 7, wherein the plurality of signal line leads are data line leads and are distributed in the first metal layer and the third metal layer, and the plurality of bonding pads are disposed in the second metal layer.

9. The array substrate according to claim 8, further comprising:
    a first insulating layer disposed between the first metal layer and the second metal layer, wherein the first insulating layer includes first via holes, and a first subset of the plurality of bonding pads is connected to signal line leads distributed in the first metal layer through the first via holes, and a second insulating layer disposed between the second metal layer and the third metal layer, wherein the second insulating layer includes second via holes, and signal line leads distributed in the third metal layer are connected to a second subset of the plurality of bonding pads through the second via holes.

10. The array substrate according to claim 7, wherein the first metal layer is made of a same material as the second metal layer.

11. The array substrate according to claim 7, wherein the first metal layer is made of a same material as the third metal layer, and signal line leads disposed in the first metal layer have a same width as signal line leads disposed in the third metal layer.

12. A display panel, comprising the array substrate according to claim 1.

13. A display device, comprising the display panel according to claim 12.

14. The array substrate according to claim 1, wherein in metal layers in which the plurality of signal line leads are distributed, a number of signal line leads distributed in each metal layer is the same.

15. The array substrate according to claim 1, wherein the array substrate is a bottom-gate array substrate.

16. A method of manufacturing an array substrate, comprising:
providing a substrate; and
forming three metal layers stacked on the substrate, wherein at least two of the three metal layers include a plurality of signal line leads disposed in a peripheral area of the array substrate, wherein
forming the three metal layers stacked on the substrate, includes:
forming a first metal layer on the substrate, wherein the first metal layer includes a first portion of the plurality of signal line leads;
forming a second metal layer at a side of the first metal layer away from the substrate, wherein the second metal layer includes a plurality of bonding pads configured to be connected to the plurality of signal line leads, and the plurality of signal line leads are connected to an integrated circuit in a driving circuit through the plurality of bonding pads; and
forming a third metal layer at a side of the second metal layer away from the substrate, wherein the third metal layer includes a second portion of the plurality of signal line leads;
the method further comprises:
forming a first insulating layer on the side of the first metal layer away from the substrate;
forming first via holes in the first insulating layer, wherein the first via holes are configured to accommodate a part of a first subset of the plurality of bonding pads, such that the first subset of the plurality of bonding pads is electrically connected to the first portion of the plurality of signal line leads;
forming a second insulating layer on the side of the second metal layer away from the substrate; and
forming second via holes in the second insulating layer, wherein the second via holes are configured to accommodate a part of the second portion of the plurality of signal line leads, such that the second portion of the plurality of signal line leads is electrically connected to a second subset of the plurality of bonding pads, the first subset of the plurality of bonding pads and the second subset of the plurality of bonding pads are arranged in two different lines that are parallel to each other, the first subset of the plurality of bonding pads are arranged in one of the two different lines, and the second subset of the plurality of bonding pads are arranged in the other of the two different lines, such that each subset of bonding pads extend to different lengths with respect to one another.

* * * * *